United States Patent [19]
Wiese et al.

[11] Patent Number: 5,936,468
[45] Date of Patent: Aug. 10, 1999

[54] OPERATIONAL AMPLIFIER HAVING TWO DIFFERENTIAL AMPLIFIERS

[75] Inventors: Peter Wiese; Burkhard Dick, both of Hamburg, Germany

[73] Assignee: U.S. Philips Corporation, New York, N.Y.

[21] Appl. No.: 08/973,072

[22] PCT Filed: Mar. 3, 1997

[86] PCT No.: PCT/IB97/00193

§ 371 Date: Nov. 3, 1997

§ 102(e) Date: Nov. 3, 1997

[87] PCT Pub. No.: WO97/33365

PCT Pub. Date: Sep. 12, 1997

[30] Foreign Application Priority Data

Mar. 5, 1996 [DE] Germany .......................... 196 08 452

[51] Int. Cl.⁶ .................................................. H03F 3/45
[52] U.S. Cl. .......................................... 330/255; 330/257
[58] Field of Search .................................. 330/252, 255, 330/257, 263, 295

[56] References Cited

U.S. PATENT DOCUMENTS

| | | | |
|---|---|---|---|
| 3,745,477 | 7/1973 | Freeborn | 330/255 X |
| 3,944,944 | 3/1976 | Ellenbecker | 330/255 X |
| 4,977,378 | 12/1990 | Tero | 330/258 |
| 5,291,149 | 3/1994 | Nunoshima | 330/255 |
| 5,371,475 | 12/1994 | Brown | 330/252 X |

FOREIGN PATENT DOCUMENTS

| | | |
|---|---|---|
| 0595589A2 | 5/1994 | European Pat. Off. . |
| 3323277C2 | 12/1983 | Germany . |
| 01098306 | 4/1989 | Japan . |

OTHER PUBLICATIONS

"1–V Operational Amplifier with Rail–to–Rail Input and Output Ranges", by J. Fonderie etal, IEEE Journal of Solid–State Circuits, vol. 24, No. 6, Dec. 1989.

*Primary Examiner*—Steven J. Mottola
*Attorney, Agent, or Firm*—Steven R. Biren

[57] ABSTRACT

An operational amplifier includes two differential amplifiers, one of which is driven directly while the other is driven via two potential shifting members. Using a control stage, currents are derived from common differential current output nodes of the differential amplifiers, and are mirrored as a current difference on an output of the operational amplifier. A larger input and output driving range is thus obtained, and the operational amplifier is also capable of operating with a low supply voltage. Furthermore, the operational amplifier can be constructed using a relatively simple configuration and also has an output which is suitable for high-impedance switching.

3 Claims, 1 Drawing Sheet

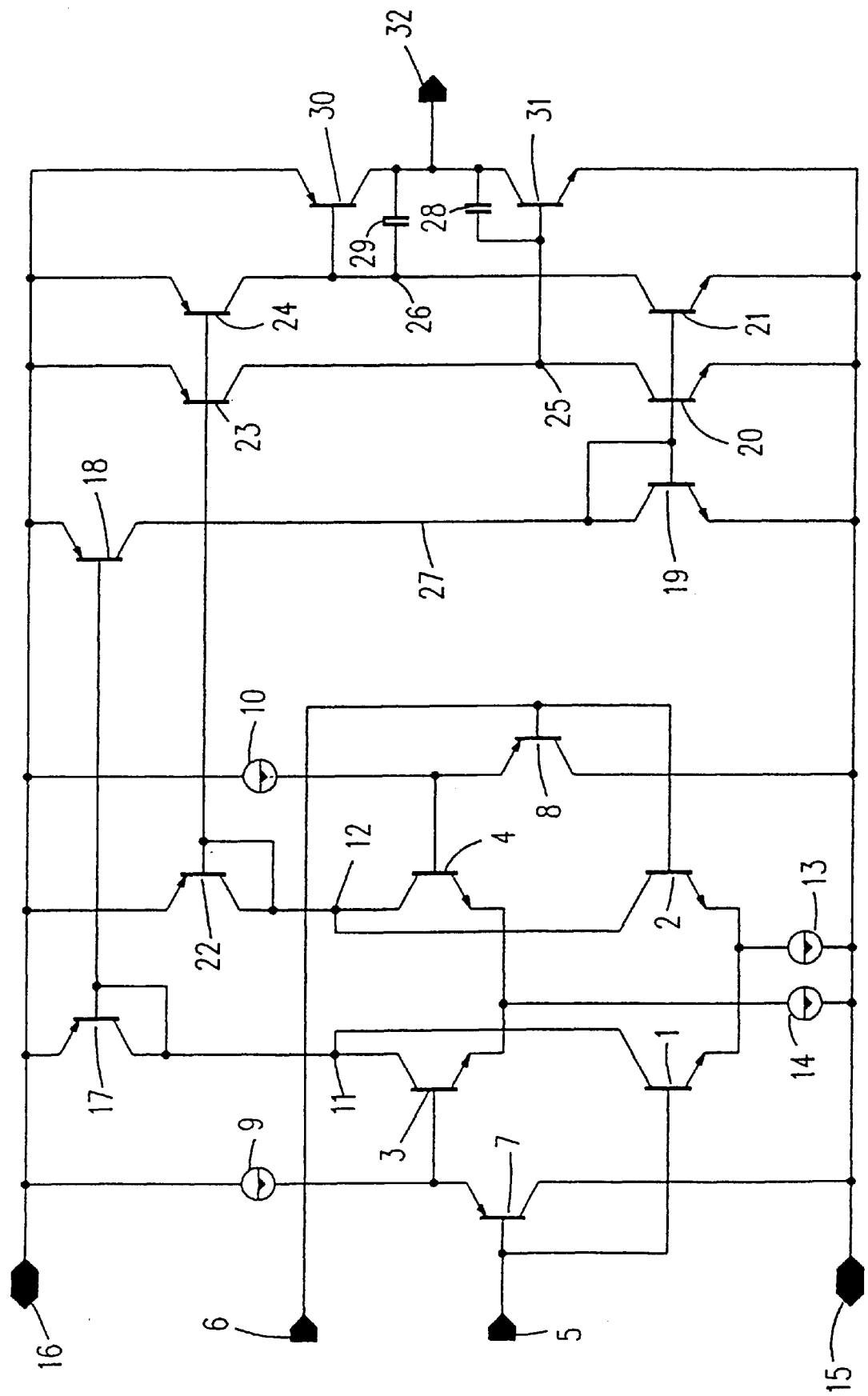

OPERATIONAL AMPLIFIER HAVING TWO DIFFERENTIAL AMPLIFIERS

BACKGROUND OF THE INVENTION

The invention relates to an operational amplifier.

A transistor amplifier which includes two emitter-coupled NPN transistor pairs is known from DE-OS 30 27 071. In the common emitter lead of each transistor pair there is connected a respective constant current source, i.e. a direct current source, whose current is independent of the voltage at the base electrodes of the associated transistor pair. The other terminal of the constant current source is connected to ground. The collector electrode of a first transistor of the first transistor pair is connected to the collector electrode of a first transistor of the second transistor pair. Analogously, the collector electrodes of the second transistors of the transistor pairs are connected to one another. The common collector terminals are connected to the positive supply voltage via a respective resistor and at the same time constitute the output terminals of the amplifier circuit. Furthermore, the base electrode of the first transistor of the first transistor pair is connected to the base electrode of the first transistor of the second transistor pair via a direct voltage source. Analogously, the base electrodes of the second transistors of the transistor pairs are connected to one another via a further direct voltage source. These two direct voltage sources, constituting a short-circuit for alternating current signals, supply the same voltage with such a polarity that the base of the first transistor of the second transistor pair is more positive than the base of the first transistor of the first transistor pair and that the base of the second transistor of the first transistor pair is more positive than the base of the second transistor of the second transistor pair. Moreover, the base electrodes of the first transistor of the first transistor pair and of the second transistor of the second transistor pair are connected to a low-impedance signal source. All transistors have the same characteristics. Particularly small non-linear distortions are achieved by selecting the direct current for the second transistor of the first transistor pair and for the first transistor of the second transistor pair so as to be from three to ten times the direct current for the other transistors.

DE-PS 33 23 277 discloses a current amplifier which includes a so-called voltage-current converter circuit which comprises a difference input and a difference output as well as two current sources which supply respective equal currents. The voltage-current converter circuit includes a resistor which is connected to the output terminals of the current sources. PNP transistors are connected, by way of their emitters, to the junctions of the output terminals of the current sources and the resistor; they convert the voltage supplied via two input terminals into a current. The bases of second NPN transistors are connected to said input terminals whereas the emitters of the relevant transistors are connected to the bases of the above-mentioned PNP transistors. The latter PNP transistors operate as emitter followers which drive the NPN transistors. The latter transistors supply collector output currents. Moreover, two further PNP transistors are connected to the input terminals by way of their bases; they constitute a first start circuit. The emitters of said further PNP transistors are connected to the junctions of the resistor and the emitter electrodes of the former PNP transistors whereas the collectors of the relevant transistors are connected to the collectors of the former PNP transistors. The further PNP transistors do not operate continuously during operation of the circuit, but are driven merely at the instant of switching on, for example when the voltage supply switch or mains switch is actuated.

Such a circuit aims to provide a current amplifier in which the effects of the base current of a common-emitter transistor pair in a multiplier circuit can be eliminated so as to enhance the linearity and the accuracy of the multiplication factor of the relevant circuit.

The article "1-V Operational Amplifier with Rail-to-Rail Input and Output Ranges" by Jeroen Fondrie in IEEE Journal of Solid-State Circuits, Vol. 24, book 6, December 1989, pp. 1551 to 1559, describes a bipolar operational amplifier whose input and output driving ranges closely approximate the potentials of the current supply terminals. The operational amplifier shown therein is suitable for supply voltages as low as one volt. It should notably be possible for the output voltage to approximate the potential of the supply voltage terminals to within 100 mV. This operational amplifier includes two mutually complementary input stages, the first of which includes an emitter-coupled transistor pair of the NPN type whereas the second stage includes a similarly coupled transistor pair of the PNP type. The collector terminals of the transistors of the two transistor pairs are connected to a summing circuit for forming an output current. Both emitter-coupled transistor pairs receive, via their base electrodes, the voltages from two push-pull input terminals, that is to say via level shift resistors between the push-pull input terminals and the base terminals of the transistors. Overall, four level shift resistors are provided, i.e. a respective resistor between the non-inverting push-pull input terminal and the base terminal of each first transistor of the emitter-coupled pairs and two further terminals between the inverting push-pull input terminal and the two remaining base terminals. The four level shift resistors are activated by four current sources. Because the push-pull input terminals can no longer reach the potential of the positive or the negative supply voltage terminal in the case of an activated level shift, the current sources are controlled in dependence on the common mode input voltage. The current sources then deliver their maximum current when the common mode input voltage is at the centre of their driving range, and the current of the current sources becomes zero when the common mode input voltage approximates the level of one of the two supply voltage terminals. A very complex circuit arrangement is required so as to achieve this effect.

SUMMARY OF THE INVENTION

It is an object of the invention to provide an operational amplifier which can operate with a lower supply voltage, has a large driving range for the input voltage and the output voltage, includes an output which is suitable for high-impedance switching, and can be constructed while using simple means.

This object is achieved according to the invention by an operational amplifier which includes a first differential amplifier which includes a first emitter-coupled pair which consists of a first and a second bipolar transistor of the NPN type, a base terminal of the first transistor being connected to a first input terminal of the operational amplifier and a base terminal of the second transistor being connected to a second input terminal of the operational amplifier, a second differential amplifier which includes a second emitter-coupled pair which consists of a third and a fourth bipolar transistor of the NPN type, a base terminal of the third transistor being connected to the first input terminal via a first potential shifting member and a base terminal of the fourth transistor being connected to the second input terminal via a second potential shifting member, the potential shifting members being constructed in such a manner that the potentials at the base terminals of the third and the fourth transistor exceed the potentials at the first and the second input terminal, respectively, by a predetermined amount during operation, a first differential current output node whereto respective collector terminals of the first and the third transistor are connected together, a second differential current output node whereto a respective collector terminal of the second and the fourth transistor are connected together, a control stage whose inputs are formed by the current output nodes, the control stage being arranged to form control currents from the currents present at its inputs and having two outputs for delivering the control currents, and an output stage with two bipolar output transistors of opposite conductivity type whose collector-emitter paths are connected in series, a respective one of the outputs of the control stage being connected to a respective base terminal of the output transistors and the connection of the collector-emitter paths of the output transistors constituting an output of the operational amplifier.

The operational amplifier according to the invention has a suitable linearity in the case of a low supply voltage and large driving ranges for the input voltage and the output voltage, since the two differential amplifiers consist of transistors of the same conductivity type. Because NPN transistors manufactured by means of preferred manufacturing methods usually have a higher current gain factor than transistors of PNP type, suitable values are achieved for the overall gain of the operational amplifier even while using simple means.

The potential shifting members used in the operational amplifier according to the invention do not require complex circuits for power supply and potential control. The potential shifting members in a further embodiment of the invention are formed by a respective transistor of the PNP type whose base terminals are connected to the associated input terminals of the operational amplifier, whose emitter terminals are connected to the associated base terminals of the third and the fourth transistor, respectively, and whose base-emitter paths are biased in the forward direction during operation.

The control stage in a preferred embodiment of the operational amplifier according to the invention includes a current mirror arrangement for each current output node such that the control currents are formed as the difference between two respective currents which are derived from the currents at the inputs of the control stage by current mirroring. This type of construction of the control stage enables both a linear transfer as well as its use in the case of very low supply voltages.

BRIEF DESCRIPTION OF THE DRAWING

The sole FIGURE shows an embodiment of the operational amplifier according to the invention.

DESCRIPTION OF THE PREFERRED EMBODIMENTS

The operational amplifier includes a first differential amplifier with a first bipolar transistor 1 and a second bipolar transistor 2, both transistors being of the NPN type and forming a first emitter-coupled pair. A second differential amplifier of the operational amplifier shown includes a second emitter-coupled pair which consists of a third bipolar transistor 3 and a fourth bipolar transistor 4, both transistors again being of the NPN type. A base terminal of the first transistor 1 is connected to a first input terminal 5 of the operational amplifier. The first input terminal 5 constitutes a non-inverting input terminal of the operational amplifier. A second input terminal 6 of the operational amplifier, constituting an inverting input of the operational amplifier, is connected to a base terminal of the second transistor 2.

A base terminal of the third transistor 3 of the second differential amplifier is connected to the first input terminal 5 via a first potential shifting member 7. Analogously, a base terminal of the fourth transistor 4 is connected to the second input terminal 6 via a second potential shifting member 8. These two potential shifting members 7, 8 are formed by a respective transistor of the PNP type, notably by the base-emitter paths thereof, so that the base terminals of these PNP transistors are connected to the associated input terminals of the operational amplifier and the emitter terminals of the PNP transistors are connected to the associated base terminals of the third transistor 3 and the fourth transistor 4, respectively. During operation, the base-emitter paths of the PNP transistors are biased in the forward direction, so that the potentials at the base terminals of the third transistor 3 and the fourth transistor 4 exceed the potentials at the first input terminal 5 and the second input terminal 6 by a predetermined amount. To this end, the potential shifting members 7, 8 are fed via a respective current source 9, 10 at the emitter side.

The first and third transistors 1, 3 are connected to a first differential current output node 11 by way of their collector terminals; analogously, the second and fourth transistors, 2, 4, are connected to a second differential current output node 12 by way of their collector terminals. At the emitter side the first emitter-coupled pair 1, 2 is connected, via a third current source 13, and the second emitter-coupled pair 3, 4 is connected, via a fourth current source 14, to a first current supply terminal 15, being ground in this case. Collector terminals of the potential shifting members 7, 8 are also connected to ground 15. A second current supply terminal 16, carrying a positive supply voltage relative to ground and hence referred to as the positive pole hereinafter, is connected to a respective terminal of the first and of the second current source 9, 10, being the terminals of the current sources 9, 10 which are remote from the potential shifting members 7, 8.

The operational amplifier shown in the Figure also includes a control stage whose inputs are formed by the current output nodes 11, 12. This control stage includes a first current mirror consisting of a first current mirror transistor 17 and a second current mirror transistor 18, a second current mirror consisting of a third, a fourth and a fifth current mirror transistor 19, 20, 21, respectively, and a third current mirror consisting of a sixth, a seventh and an eighth current mirror transistor 22, 23, 24, respectively. The first and the second current mirror together constitute a first current mirror arrangement which derives, from the current at its input which is formed by the first current output node 11, a first and a second current on a respective collector terminal of the fourth and fifth current mirror transistors 20, 21 by current mirroring.

Analogously, the third current mirror constitutes a second current mirror arrangement which can derive, from the current at the second current output node 12, a third and a fourth current on collector terminals of the seventh and eighth current mirror transistors 23, 24, respectively, by current mirroring. To this end, the second differential current output node 12 forms the input of the second current mirror arrangement 22, 23, 24.

The first, second, sixth, seventh and eighth current mirror transistors, 17, 18, 22, 23, 24, in the embodiment shown are connected to the positive pole 16 at the emitter side, the third, fourth and fifth current mirror transistors being connected to ground 15 at the emitter side. The base and collector terminals of the first, third and sixth current mirror transistors, 17, 19, 22 are interconnected, and the base terminals of the current mirror transistors of each of the three current mirrors are always interconnected in a customary manner. The connected base and collector terminals of the first and sixth current mirror transistors 17, 22 are connected to the first and second current output nodes, 11, 12. The collector terminals of the fourth and seventh current mirror transistors are interconnected at a first output of the control stage comprising the three current mirrors 17 to 24; this first output of the control stage is denoted by the reference numeral 25. A second output 26 of the control stage connects the collector terminals of the fifth and eighth current mirror transistors to one another. Moreover, the collector terminals of the second and third current mirror transistors 18, 19 are interconnected at a junction 27.

The embodiment of the operational amplifier shown also includes an output stage with two bipolar output transistors 30, 31. The first of these output transistors is denoted by the reference numeral 30 and is of the PNP type whereas the second output transistor 31 is of the (opposite) NPN type. The collector-emitter paths of the output transistors 30, 31 are connected in series, that is to say via their collector terminals which are also connected to an output 32 of the operational amplifier. A respective capacitance 28, 29 is connected between the output 32 and the first output 25 and the second output 26, respectively, of the control stage. At the emitter side the first output transistor 30 is connected to the positive pole 16 and the second output transistor 31 is connected to ground 15. A base terminal of the first output transistor 30 is connected to the second output 26 and a base terminal of the second output transistor 31 is connected to the first output 25 of the control stage.

The present operational amplifier utilizes two differential amplifiers 1, 2 and 3, 4 of the NPN type in its input section. Both differential amplifiers operate on the common current output nodes 11, 12. The first of the differential amplifiers serving as input stages consists of the first and second transistors 1, 2 and is intended to transfer notably the upper range of the common mode input voltage; analogously, the input stage formed by the second differential amplifier 3, 4 covers the lower range of the common mode input voltage. The potential shifting members 7, 8 enable the second differential amplifier 3, 4 to operate with voltages on the input terminals 5, 6 which are at least approximately zero with respect to ground 15; to this end, the potential shifting members increase the voltages at the base terminals of the third and fourth transistors 3, 4 with respect to the voltages at the input terminals 5 and 6, respectively, by a respective diode forward voltage which also appears between the base and the emitter terminal of each of the transistors 3, 4 of the second differential amplifier during operation. The constant currents to be supplied by the first and second current sources 9, 10 should be chosen accordingly.

The current from the first differential current output node 11 of the differential amplifier 1 to 4 is mirrored, via the first current mirror 17, 18, to the junction 27 and further, via the second current mirror 19 to 21, to the outputs 25, 26 of the control stage. Via the third current mirror 22 to 24, the current from the second differential current output node 12 is also mirrored on the outputs 25, 26. Thus, at each of the outputs 25, 26 of the control stage there is formed a difference between currents formed from the currents at the current output nodes 11, 12. These current differences serve to control the output transistors 30, 31 which provide current amplification of the difference currents at the outputs 25, 26; these amplified currents are made available, again as a difference, at the output 32 of the operational amplifier. The operational amplifier according to the invention is preferably intended to create a large driving range for its input and output voltages. This principal object is achieved by means of limited circuit means; this purpose is also served by the combination of the collector terminals of the transistors of the differential amplifiers in only two differential current output nodes. The common mode input voltage and the common mode output voltage cover at least approximately the entire supply voltage range between the potentials at the positive pole and ground. Perfect operation is then also achieved in the case of very small supply voltages, for example amounting to 1.3 V, between the positive pole and ground.

The operational amplifier according to the invention is advantageously used to drive a varactor diode for readjusting an oscillator through an as large as possible frequency range. To this end, additional elements for linearizing the functional relationship between input voltage and output voltage can be dispensed with. This and the previously described simplifications of the circuit arrangement are not affected by the fact that, in order to achieve correct operation throughout the entire driving range between the potentials of the positive pole and ground, the differential amplifiers are fed from separate constant current sources, being the current sources 13, 14 in the embodiment shown.

For the application of driving a varactor diode, it is also an advantage of the operational amplifier according to the invention that the output 32 is a high-impedance output in the currentless, switched-off state. If the output 32 is succeeded by a passive low-pass filter via which the varactor diode is driven, the operational amplifier and the low-pass filter can operate as a sample-and-hold circuit for the tuning voltage of the varactor diode without additional steps being required.

The operational amplifier can be advantageously used in an oscillator for a radio receiver (pager).

In the circuit arrangement for the present embodiment of the operational amplifier according to the invention the slope in its central input voltage range is doubled relative to that in its extreme ranges. In order to avoid such a slope increase, current switching can be provided between the two differential amplifiers, only one of the current sources associated with the differential amplifiers then being active at a time. The slope can thus be kept constant across the entire input voltage range.

What is claimed is:

1. An operational amplifier which includes:
    a first differential amplifier which includes a first emitter-coupled pair which consists of a first and a second bipolar transistor of the NPN type, a base terminal of the first transistor being connected to a first input terminal of the operational amplifier and a base terminal of the second transistor being connected to a second input terminal of the operational amplifier,
    a second differential amplifier which includes a second emitter-coupled pair which consists of a third and a fourth bipolar transistor of the NPN type, a base terminal of the third transistor being connected to the first input terminal via a first potential shifting member and a base terminal of the fourth transistor being connected to the second input terminal via a second potential shifting member, the potential shifting members being constructed in such a manner that the potentials at the base terminals of the third and the fourth transistor exceed the potentials at the first and the second input terminal, respectively, by a predetermined amount during operation, a first differential current output node whereto respective collector terminals of the first and the third transistor are connected together, a second differential current output node whereto respective collector terminals of the second and the fourth transistor are connected together, a control stage whose inputs are formed by the current output nodes, the control stage being arranged to form control currents from the currents present at its inputs and having two outputs for delivering the control currents, and an output stage with two bipolar output transistors of opposite conductivity type whose collector-emitter paths are connected in series, a respective one of the outputs of the control stage being connected to a respective base terminal of the output transistors and the connection of the collector-emitter paths of the output transistors constituting an output of the operational amplifier.

2. An operational amplifier as claimed in claim 1, characterized in that the potential shifting members are formed by a respective transistor of the PNP type whose base terminals are connected to the associated input terminals of the operational amplifier, whose emitter terminals are connected to the associated base terminals of the third and the fourth transistor, respectively, and whose base-emitter paths are biased in the forward direction during operation.

3. An operational amplifier as claimed in claim 1, characterized in that the control stage includes a current mirror arrangement for each current output node such that the control currents are formed as the difference between two respective currents which are derived from the currents at the inputs of the control stage by current mirroring.

\* \* \* \* \*